United States Patent
Kobayashi

(10) Patent No.: US 10,909,021 B2
(45) Date of Patent: Feb. 2, 2021

(54) ASSISTANCE DEVICE, DESIGN ASSISTANCE METHOD, AND RECORDING MEDIUM STORING DESIGN ASSISTANCE PROGRAM

(71) Applicant: NEC Corporation, Tokyo (JP)

(72) Inventor: Yuki Kobayashi, Tokyo (JP)

(73) Assignee: NEC CORPORATION, Tokyo (JP)

( * ) Notice: Subject to any disclaimer, the term of this patent is extended or adjusted under 35 U.S.C. 154(b) by 182 days.

(21) Appl. No.: 16/073,875

(22) PCT Filed: Jan. 31, 2017

(86) PCT No.: PCT/JP2017/003311
§ 371 (c)(1),
(2) Date: Jul. 30, 2018

(87) PCT Pub. No.: WO2017/135219
PCT Pub. Date: Aug. 10, 2017

(65) Prior Publication Data
US 2019/0042389 A1 Feb. 7, 2019

(30) Foreign Application Priority Data
Feb. 1, 2016 (JP) .................. 2016-017051

(51) Int. Cl.
G06F 11/34 (2006.01)
G06F 30/00 (2020.01)
G06F 11/30 (2006.01)

(52) U.S. Cl.
CPC ...... *G06F 11/3495* (2013.01); *G06F 11/3419* (2013.01); *G06F 30/00* (2020.01); *G06F 11/3024* (2013.01); *G06F 11/3409* (2013.01)

(58) Field of Classification Search
CPC ............ G06F 11/3024; G06F 11/3409; G06F 11/3419; G06F 11/3495; G06F 17/50; G06F 30/00
(Continued)

(56) References Cited

U.S. PATENT DOCUMENTS 8,769,357 B1 * 7/2014 Weintraub ..... G01R 31/318519
714/725
2006/0190905 A1 * 8/2006 Martin .................... G06F 30/34
716/102
(Continued)

FOREIGN PATENT DOCUMENTS

JP 2003-067439 A 3/2003
JP 2010-113384 A 5/2010
(Continued)

OTHER PUBLICATIONS

International Search Report of PCT/JP2017/003311 dated May 9, 2017 [PCT/ISA/210].
(Continued)

*Primary Examiner* — Paul D Lee
(74) *Attorney, Agent, or Firm* — Sughrue Mion, PLLC

(57) ABSTRACT

A design assistance method executed by a design assistance device for a computer system including a CPU and an accelerator, the design assistance method includes: extracting, from an input program described in a high-level language, a process including a function and data including a variable, and analyzing a relationship between a process and data, the relationship including an amount of access from the process to the data, based on a number of times of execution of the function or a loop; evaluating, for the acquired process, a used amount of resource, a delay, and a communication band of the accelerator, based on a hardware specification; and generating, for the acquired process and data, candidates represented by a combination of allocations to the CPU and the accelerator, and acquiring and presenting, for each of the candidates, a used amount of resource, a communication band, and performance of the input program.

18 Claims, 14 Drawing Sheets

(58) Field of Classification Search
USPC .......................................................... 702/182
See application file for complete search history.

(56) References Cited

U.S. PATENT DOCUMENTS

2014/0282588 A1   9/2014   Suzuki et al.
2015/0205643 A1   7/2015   Miyamoto

FOREIGN PATENT DOCUMENTS

| JP | 5153904 B2 | 2/2013 |
| JP | 2014-106639 A | 6/2014 |
| WO | 2012/124125 A1 | 9/2012 |
| WO | 2014/002412 A1 | 1/2014 |

OTHER PUBLICATIONS

Written Opinion of PCT/JP2017/003311 dated May 9, 2017 [PCT/ISA/237].
NEC India PVT Ltd, "CyberWorkBench NEC's High Level Synthesis Solution", Sep. 1, 2016, pp. 1-37, [online], the Internet (URL: https://www.nec.com/en/global/prod/cwb/index.html).
Moritaka et al., "SoC System Design Methodology with Fully-Coherent Cache", IEICE Technical Report, The Institute of Electronics, Information and Communication Engineers, vol. 113, No. 30, VLD2013-10, 2013, pp. 73-78 (total 6 pages).
Yoshida et al., "Rapid SoC Prototyping Based on Virtual Multi-Processor Model", The Institute of Electronics, Information and Communication Engineers, IEICE Technical Report, Nov. 2010, vol. 110, No. 317, pp. 7-12 (total 6 pages).
Communication dated Aug. 11, 2020 from Japanese Patent Office in JP Application No. 2017-565548.

\* cited by examiner

Fig. 7A

| | PROCESS ALLOCATION 1 | PROCESS ALLOCATION 2 | PROCESS ALLOCATION 3 | PROCESS ALLOCATION 4 | PROCESS ALLOCATION 5 | PROCESS ALLOCATION 6 | PROCESS ALLOCATION 7 | PROCESS ALLOCATION 8 |
|---|---|---|---|---|---|---|---|---|
| funcA | CPU | Acc | CPU | Acc | CPU | Acc | CPU | Acc |
| funcB | CPU | CPU | Acc | Acc | CPU | CPU | Acc | Acc |
| main | CPU | CPU | CPU | CPU | Acc | Acc | Acc | Acc |

Fig. 7B

|   | DATA ALLOCA-TION 1 | DATA ALLOCA-TION 2 | DATA ALLOCA-TION 3 | DATA ALLOCA-TION 4 | DATA ALLOCA-TION 5 | DATA ALLOCA-TION 6 | ... | DATA ALLOCA-TION 16 |
|---|---|---|---|---|---|---|---|---|
| A | CPU | Acc | CPU | Acc | CPU | Acc | | Acc |
| B | CPU | CPU | Acc | Acc | CPU | CPU | | Acc |
| R | CPU | CPU | CPU | CPU | Acc | Acc | | Acc |
| T | CPU | CPU | CPU | CPU | CPU | CPU | | Acc |

Fig. 8

|  | PROCESS IMPLEMEN-TATION SCHEME 1 | PROCESS IMPLEMEN-TATION SCHEME 2 | PROCESS IMPLEMEN-TATION SCHEME 3 | PROCESS IMPLEMEN-TATION SCHEME 4 | ... | PROCESS IMPLEMEN-TATION SCHEME X | ... | PROCESS IMPLEMEN-TATION SCHEME Y |
|---|---|---|---|---|---|---|---|---|
| Functional UnitType | Pipeline | Pipeline | Pipeline | Pipeline | | Pipeline | | Sequential |
| Pipeline Stages | 24 | 24 | 24 | 24 | | 23 | | 1 |
| DII | 1 | 1 | 2 | 2 | | 1 | | - |
| Data Access | RingBuf | Direct | RingBuf | Direct | | RingBuf | | Direct |

Fig. 9

| | PROCESS IMPLE-MENTA-TION SCHEME 1 | PROCESS IMPLE-MENTA-TION SCHEME 2 | PROCESS IMPLE-MENTA-TION SCHEME 3 | PROCESS IMPLE-MENTA-TION SCHEME 4 | ... | PROCESS IMPLE-MENTA-TION SCHEME X | ... | PROCESS IMPLE-MENTA-TION SCHEME Y |
|---|---|---|---|---|---|---|---|---|
| ASSUMED FREQUENCY (MHz) | 100 | 100 | 100 | 100 | | 100 | | 100 |
| USED AMOUNT OF RESOURCE | 50000 | 51000 | 25000 | 26000 | | 48000 | | 15000 |
| DELAY | 24 | 24 | 24 | 24 | | 23 | | 30 |
| THROUGHPUT | 1 | 1 | 2 | 2 | | 1 | | 30 |
| COMMUNICA-TION BAND (MB/s) | 12 | 12 | 6 | 6 | | 12 | | 0.4 |

ASSISTANCE DEVICE, DESIGN ASSISTANCE METHOD, AND RECORDING MEDIUM STORING DESIGN ASSISTANCE PROGRAM

CROSS REFERENCE TO RELATED APPLICATIONS

This application is a National Stage of International Application No. PCT/JP2017/003311, filed Jan. 31, 2017, claiming priority based on Japanese Patent Application No. 2016-017051, filed Feb. 1, 2016, the contents of all of which are incorporated herein by reference in their entirety.

TECHNICAL FIELD

One example embodiment of the present invention relates to a design assistance device and the like for a computer system including a CPU (Central Processing Unit) and an accelerator.

BACKGROUND ART

An accelerator is a general term for hardware or software to be added and used in order to enhance a throughput of a computer. As a technique for enhancing speed and efficiency of calculation at a relatively low cost, an operation using a dedicated circuit mounted on a FPGA (Field Programmable Gate Array) or GPGPU (General Purpose computing on Graphics Processing Unit) is known. The FPGA is mainly described herein as an example of the accelerator. Other accelerators, such as the GPGPU, may also be assumed as the accelerator.

Various types of design assistance devices for a computer system including the CPU and an accelerator of this type are known.

PTL 1 discloses a "high-level synthesis device" including a means for correcting a circuit in such a way as to share a same memory for memory accesses of different types in high-level synthesis.

PTL 2 discloses a "program operation estimating method" for calculating a communication band based on the number of access times to a memory and calculating a probability of a bus conflict. A modeling/simulation system disclosed in PTL 2 is preferably a simulation system based on a UML (Unified Modeling Language) and includes a model editor and a calculation module. The calculation module estimates values, such as an execution time and a memory band utilization rate, in accordance with a predetermined evaluation algorithm.

PTL 3 discloses a "system simulation method" for reducing an amount of communication between a hardware emulator and a CPU for causing a simulator to operate during simulation. As a simulation means, a hardware simulator on a computer and a hardware emulator composed of a programmable device are used in combination. In a simulation means allocation step, there are groups including a group to which a hardware emulator is allocated and a group to which a simulation on the computer is allocated, and grouping can be obtained with a minimum amount of boundary communication. In the simulation means allocation step, initial grouping and calculation of an amount of boundary communication based on the initial grouping are carried out. Next, creation of grouping candidates and calculation of the amount of boundary communication in the grouping candidates are carried out. Thus, the simulator on the computer is allocated to a CPU and a memory, and the hardware emulator is allocated to each specific function block.

PTL 4 discloses a technique for optimizing software for a heterogeneous multicore and an allocation technique in which a communication cost is taken into consideration. A design assistance device disclosed in PTL 4 includes an acquisition unit and an extraction unit. The acquisition unit has a function of acquiring setting information about a type of a processor element incorporated in an embedded system and an optimization process to be executed by the processor element. The extraction unit has a function of extracting, from a plurality of tasks, a task capable of executing an optimization process depending on the type of the processor element included in the setting information. The extraction unit selects a program pattern that matches the setting information from an analysis routine for extracting a program pattern prepared in advance, and extracts a task corresponding to the selected program pattern from the plurality of tasks. For example, when the type of the processor element (PE) is a "reconfiguration circuit" and the optimization technique is "pipeline", an analysis routine for a pipeline process is selected and a target program code is analyzed for each divided task.

CITATION LIST

Patent Literature

[PTL 1] Japanese Unexamined Patent Application Publication No. 2014-106639
[PTL 2] Japanese Patent No. 5153904
[PTL 3] Japanese Unexamined Patent Application Publication No. 2003-67439
[PTL 4] Japanese Unexamined Patent Application Publication No. 2010-113384

Non Patent Literature

[NPL 1] "CyberWorkBench" (registered trademark), NEC Corporation, [online], the Internet (URL: http://jpn.nec.com/cyberworkbench/)

SUMMARY OF INVENTION

Technical Problem

However, the above-described PTLs 1 to 4 have problems as described below.

The above-described PTLs 1 to 3 are intended for a simulation and an implementation on a real system is not taken into consideration. Specifically, a delay in communication between the CPU and the hardware emulator is large, and characteristics are different when frequently exchanging data, thereby it is difficult to directly apply the techniques to the real system.

PTL 3 discloses a technique for determining whether or not to perform an allocation to a hardware emulator based on the communication amount, but fails to take into consideration the fact that the communication amount varies depending on an operation method. In addition, a circuit on a side of the hardware emulator is not obtained by high-level synthesis.

A throughput depends on a bus frequency and a bus width. In PTL 4, the parallel number of computing units is taken into consideration, but the throughput of the computing unit, such as a Data Initiation Interval (DII), is not taken into consideration.

In general, a related design assistance device is often recognized as a device for solving a problem of hardware and software division. In a case of offloading a process from a CPU to an accelerator, such as an FPGA, the related design assistance device generally transfers input data to a side of the accelerator collectively and then transfers output data collectively from the accelerator side after the data are processed. In this case, there is a search problem with determination of arrangement of a process in order to maximize performance under resource constraints on the accelerator side (under area constraints in the case of the FPGA).

In recent years, an architecture in which a CPU and an FPGA maintain memory coherency has been proposed, and a case where data in a CPU-side memory are used by a process arranged on the FPGA side has been assumed. In particular, when a memory is accessed a plurality of times, data are preferably stored in an accelerator-side memory in such a way as to save a band. However, it is often difficult to store all data in the accelerator-side memory due to a memory capacity constraint in the accelerator-side memory.

In this case, it is necessary to optimize not only a process arrangement, but also a data arrangement, under constraints of a communication band between the CPU and the accelerator and a capacity of the accelerator-side memory, and resource constraints in the accelerator. The term "resource constraints" used herein refers to area constraints in the case of the FPGA. The term "process arrangement" refers to an arrangement for determining whether a process is executed on the accelerator side or on the CPU side. The term "data arrangement" refers to an arrangement for determining whether data are stored in the accelerator-side memory or in the CPU-side memory. A communication band and an area largely depend on a computing unit implementation scheme, such as a throughput and an operation method of a circuit. The term "throughput of a circuit" used herein refers to a DII (Data Initiation Interval). Examples of the "operation method" include a tiling method and a line buffer method.

As described above, the related techniques have problems that it is difficult for the related design assistance device to achieve an optimum system design and design workloads are increased.

An object of one example embodiment of the present invention is to provide a design assistance device and the like for solving the above-described problems.

Solution to Problem

A design assistance device for a computer system including a CPU and an accelerator according to one aspect of the present invention, the design assistance device includes program analysis means for extracting, from an input program described in a high-level language, a process including a function and data including a variable, which are included in the input program, and analyzing a relationship between a process and data, the relationship including an amount of access from the process to the data, based on a number of times of execution of the function or a loop. The design assistance device includes computing unit implementation scheme evaluation means for evaluating, for the acquired process, a used amount of resource, a delay, and a communication band of the accelerator, based on a hardware specification including an operating frequency and a model number of the accelerator; and design space search means for generating, for the acquired process and data, candidates represented by a combination of allocations to the CPU and the accelerator, and acquiring and presenting, for each of the candidates, a used amount of resource, a communication band, and performance of the input program as a whole, based on a result of evaluation of the computing unit implementation scheme evaluation means.

A design assistance method executed by a design assistance device for a computer system including a CPU and an accelerator according to one aspect of the present invention, the design assistance method includes extracting, from an input program described in a high-level language, a process including a function and data including a variable, which are included in the input program, and analyzing a relationship between a process and data, the relationship including an amount of access from the process to the data, based on a number of times of execution of the function or a loop. Further, the design assistance method includes evaluating, for the acquired process, a used amount of resource, a delay, and a communication band of the accelerator, based on a hardware specification including an operating frequency and a model number of the accelerator; and generating, for the acquired process and data, candidates represented by a combination of allocations to the CPU and the accelerator, and acquiring and presenting, for each of the candidates, a used amount of resource, a communication band, and performance of the input program as a whole, based on the evaluation result.

A recording medium stores a design assistance program causing a computer to perform design assistance for a computer system including a CPU and an accelerator. The design assistance program causes the computer to execute processing of: extracting, from an input program described in a high-level language, a process including a function and data including a variable, which are included in the input program, and analyzing a relationship between a process and data, the relationship including an amount of access from the process to the data, based on a number of times of execution of the function or a loop. Further, the design assistance program causing the computer to execute processing of evaluating, for the acquired process, a used amount of resource, a delay, and a communication band of the accelerator, based on a hardware specification including an operating frequency and a model number of the accelerator; and generating, for the acquired process and data, candidates represented by a combination of allocations to the CPU and the accelerator, and acquiring and presenting, for each of the candidates, a used amount of resource, a communication band, and performance of the input program as a whole, based on the evaluation result.

Advantageous Effects of Invention

According to one embodiment of the present invention, it is possible to reduce design workloads.

BRIEF DESCRIPTION OF DRAWINGS

FIG. 7A is a diagram illustrating an output example of a process allocation listing unit in the design space search unit used for the design assistance device;

FIG. 7B is a diagram illustrating an output example of a data allocation listing unit in the design space search unit used for the design assistance device;

FIG. 8 is a diagram illustrating an output example of a computing unit implementation scheme listing unit in the design space search unit used for the design assistance device;

FIG. 9 is a diagram illustrating an output example of a computing unit implementation scheme evaluation unit used for the design assistance device;

EXAMPLE EMBODIMENT

Example Embodiments

Next, modes for carrying out the invention will be described in detail with reference to the drawings.

Figure 5:
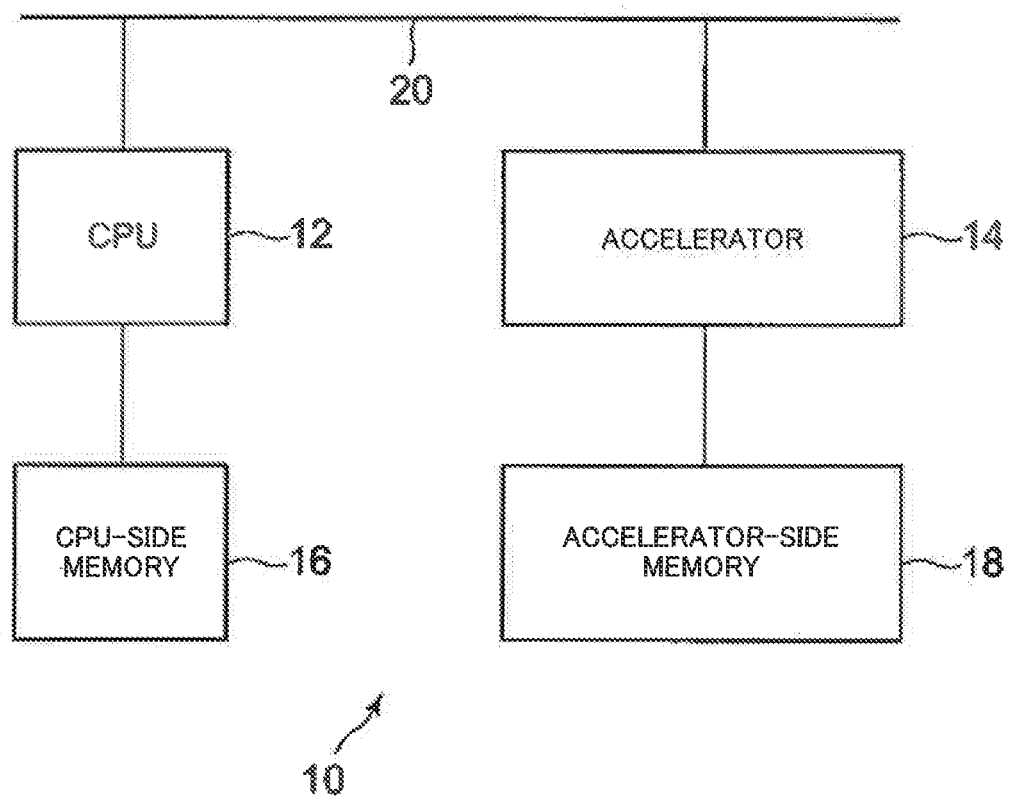
FIG. 5 is a block diagram illustrating a computer system for which the design assistance device is used.

FIG. 5 is a block diagram illustrating a computer system 10 for which a design assistance device 100 according to one example embodiment of the present invention as described below is used.

As illustrated in FIG. 5, the computer system 10 includes a CPU 12, an accelerator 14, a CPU-side memory 16, and an accelerator-side memory 18.

The CPU 12 and the accelerator 14 are connected to the CPU-side memory 16 and the accelerator-side memory 18, respectively. Further, the CPU 12 and the accelerator 14 are connected through a bus 20. Through the bus 20, the accelerator-side memory 18 can be accessed from the CPU 12 and the CPU-side memory 16 can be accessed from the accelerator 14.

The design assistance device 100 according to the example embodiment of the present invention is a design assistance device for the computer system 10 as described above and searches for an optimum arrangement of a process and data in consideration of a communication bus band between the CPU 12 and the accelerator 14. Further, the design assistance device 100 according to the example embodiment of the present invention evaluates various types of process implementation methods, especially, on the accelerator 14, and searches for an optimum implementation method in consideration of an amount of communication between the CPU 12 and the accelerator 14 that varies depending on the implementation method.

The FPGA is mainly described herein as an example of the accelerator 14, but instead other accelerators, such as the GPGPU, may be assumed as the accelerator.

Description of Configuration

Figure 1:
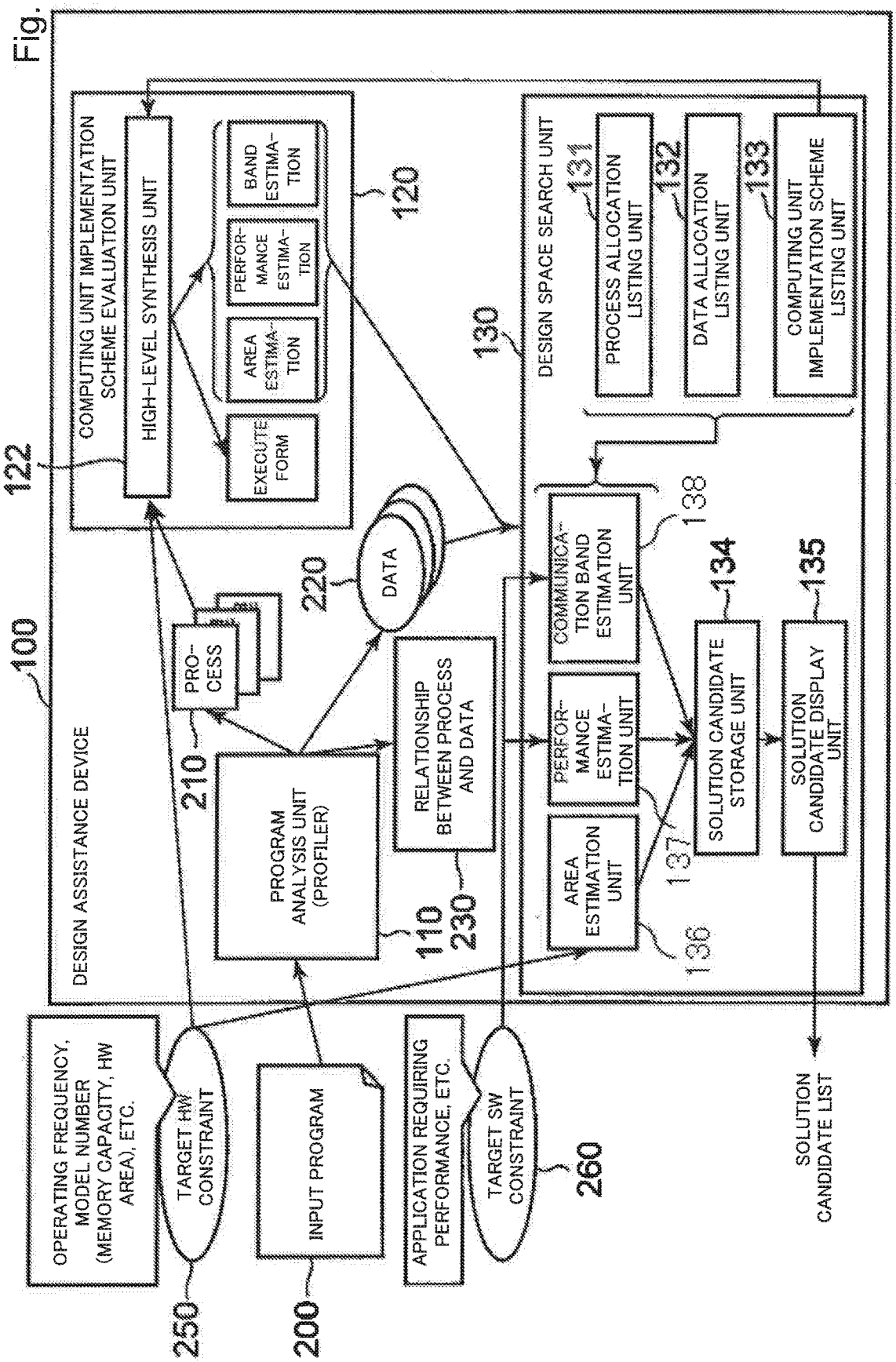
FIG. 1 is a block diagram illustrating a schematic configuration of a design assistance device according to one example embodiment of the present invention.

Referring to FIG. 1, a design assistance device 100 according to one example embodiment of the present invention includes a program analysis unit 110, a computing unit implementation scheme evaluation unit 120, and a design space search unit 130.

The program analysis unit 110 analyzes an input program 200 described in a high-level language as an input, extracts a process 210 such as a function and data 220 such as a variable and an array, which are included in the input program 200, and outputs the process 210 and data 220 in the input program 200, and a relationship 230 between a process and data.

In this case, the process 210 may be, for example, a function. The data 220 may be, for example, a variable (including an array variable). The relationship 230 between a process and data is information indicating an access amount denoting how many bytes of a certain process 210 are accessed to certain data 220.

The analysis of the input program 200 includes a static analysis and a dynamic analysis. In the static analysis, a function name, an argument, a variable name, and a type and size of a variable in the input program 200 are extracted by syntax analysis and semantic analysis of the input program 200. In the dynamic analysis, the number of times of execution of a loop, the number of times of access to each variable, and the amount of access can be obtained by executing the input program 200. Note that a C program, a C++ program, a System C (registered trademark) program, an OpenCL (registered trademark) program, or the like is assumed as the input program 200, but the input program is not limited to this.

The computing unit implementation scheme evaluation unit 120 receives the process 210, computing unit implementation scheme designation information, and a target HW (hardware) constraint 250 including an operating frequency and a model number of an accelerator, and outputs a process executable model (execute form), an estimation of a used amount of resource, an estimation of a delay, an estimation of a throughput, and an estimation of a communication band.

In this case, the process executable model is a RTL (register transfer level) description when an FPGA is used. The estimation of the used amount of resource is an area estimation when the FPGA is used. The estimation of a delay and the estimation of a throughput are collectively referred to as estimation of a performance.

Figure 6A:
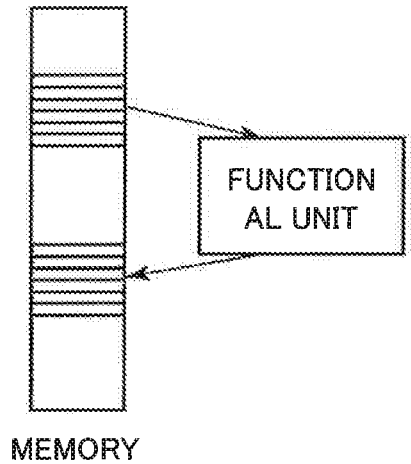
FIG. 6A is a diagram illustrating an example of computing unit implementation scheme designation information used for the design assistance device.
Figure 6B:
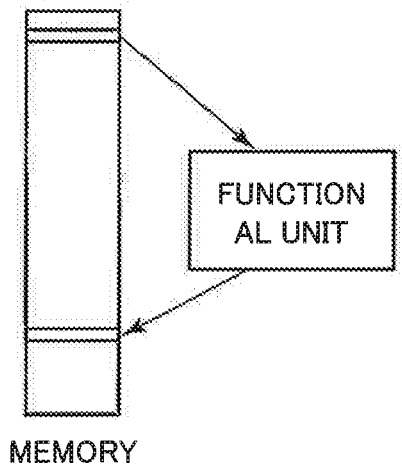
FIG. 6B is a diagram illustrating an example of computing unit implementation scheme designation information used for the design assistance device.

FIGS. 6A and 6B are diagrams each illustrating an example of the computing unit implementation scheme designation information.

FIG. 6A illustrates an example of the computing unit implementation scheme designation information in which a pipeline computing unit is designated as a computing unit; 2 is designated as DII; 24 is designated as the number of pipeline stages; and a ring buffer is designated as a data access method. This indicates a 24-stage pipeline computing unit which is capable of data initiation every two cycles and is implemented as a computing unit that receives and outputs data through a ring buffer. Specifically, input data loaded by the CPU from a memory are written into the ring buffer, and the computing unit is notified of the input data by, for example, updating a write pointer of the ring buffer. The computing unit loads the input data from the ring buffer and performs an operation.

FIG. 6B illustrates an example of the computing unit implementation scheme designation information in which a pipeline computing unit is designated as a computing unit; 4 is designated as DII; 20 is designated as the number of pipeline stages; and a direct access method is designated as a data access method. This indicates a 20-stage pipeline computing unit which is capable of data initiation every four cycles and is implemented as a computing unit that receives and outputs data in such a way as to generate an address in the computing unit and directly access a memory by using the generated address.

Note that the computing unit implementation scheme evaluation unit 120 uses a high-level synthesis unit 122 as a high-level synthesis tool such as CyberWorkBench (NPL 1), thereby making it possible to obtain a used amount of resource and a delay for the designated DII and operating frequency constraint.

In this case, a communication band B (MB/sec) is represented by B=(F×M)/T using a process operating frequency F (MHz), a throughput T (cycle), and a required data input/output amount M (byte) per process execution. Note that when an input band and an output band are independent in a communication path between the CPU 12 and the accelerator 14, a data input amount and a data output amount may be considered separately. In this case, the throughput T indicates that one process can be started in a T cycle.

Referring again to FIG. 1, the design space search unit 130 includes a process allocation listing unit 131, a data allocation listing unit 132, a computing unit implementation scheme listing unit 133, a solution candidate storage unit 134, and a solution candidate display unit 135.

The design space search unit 130 receives the target HW constraint 250, a target SW (software) constraint 260, such as an application requiring performance, the relationship 230 between a process and data, the data 220, an area estimation from the computing unit implementation scheme evaluation unit 120, a performance estimation, and a band estimation.

In the design space search unit 130, solution candidates in a design space are first listed by using the process allocation listing unit 131, the data allocation listing unit 132, and the computing unit implementation scheme listing unit 133. For design candidates as the respective listed solution candidates, a used amount of resource, a process delay, and a communication band are estimated by using an area estimation unit, a performance estimation unit, and a communication band estimation unit in the design space search unit 130. Estimated results are stored in the solution candidate storage unit 134 together with the solution candidates. Further, the design space search unit 130 presents, to a designer, the content stored in the solution candidate storage unit 134 by using the solution candidate display unit 135, and also outputs an optimum solution candidate. Note that an area estimation unit 136, a performance estimation unit 137, and a communication band estimation unit 138 in the design space search unit 130 estimates each process constituting a solution candidate by combining estimation results from the high-level synthesis unit 122. Note that the design space search unit 130 may output not only information about solution candidates, but also execute forms of the solution candidates. The used amount of resource, process delay, and communication band of each design candidate are collectively referred to as a design space.

In this manner, the design space search unit 130 searches for a design space by using the communication band between the CPU 12 and the accelerator 14 as a constraint.

FIGS. 7A and 7B and FIG. 8 are diagrams each illustrating an operation example of the design space search unit 130.

FIG. 7A is a diagram illustrating an output example of the process allocation listing unit 131. In this case, an example in which three processes of funcA, funcB, and main are used is illustrated. The process allocation listing unit 131 generates all combinations to be allocated to either the CPU 12 or the accelerator 14 for each process. Specifically, when three processes are used, 2^3=8 types of process allocations are output.

FIG. 7B is a diagram illustrating an output example of the data allocation listing unit 132. In this case, an example in which four pieces of data, i.e., A, B, R, and T, are used is illustrated. The data allocation listing unit 132 generates, for each data, all combinations to be allocated to either the CPU-side memory 16 or the accelerator-side memory 18. Specifically, when four pieces of data are used, 2^4=16 types of data allocations are output.

FIG. 8 is a diagram illustrating an output example of the computing unit implementation scheme listing unit 133. The computing unit implementation scheme listing unit 133 generates all combinations of a computing unit, the number of pipeline stages, the DII, and a data access method, which are items for each process implementation scheme.

For example, candidates for a type of the computing unit include a pipeline and a sequential type, and candidates for the data access method include a ring buffer method and a direct access method. Candidates for the number of pipeline stages and DII include 1, 2, 3, . . . , but instead a minimum value and a maximum value among values that can be taken may be separately set (e.g., 1 to 24). The program analysis unit 110 may carry out a high-level synthesis to estimate the number of steps in a process, thereby setting the minimum value and the maximum value. Depending on the combination of items, an invalid combination (e.g., DII is not designated in a sequential computing unit) or a uniquely determined item (e.g., the number of pipeline stages is 1 in the sequential computing unit) is assumed. Such constraints may be incorporated in each process implementation scheme.

FIG. 9 is a diagram illustrating an output example of the computing unit implementation scheme evaluation unit 120. The computing unit implementation scheme evaluation unit 120 outputs estimated values of the used amount of resource, delay, throughput, and communication band, for each process implementation scheme.

Figure 10:
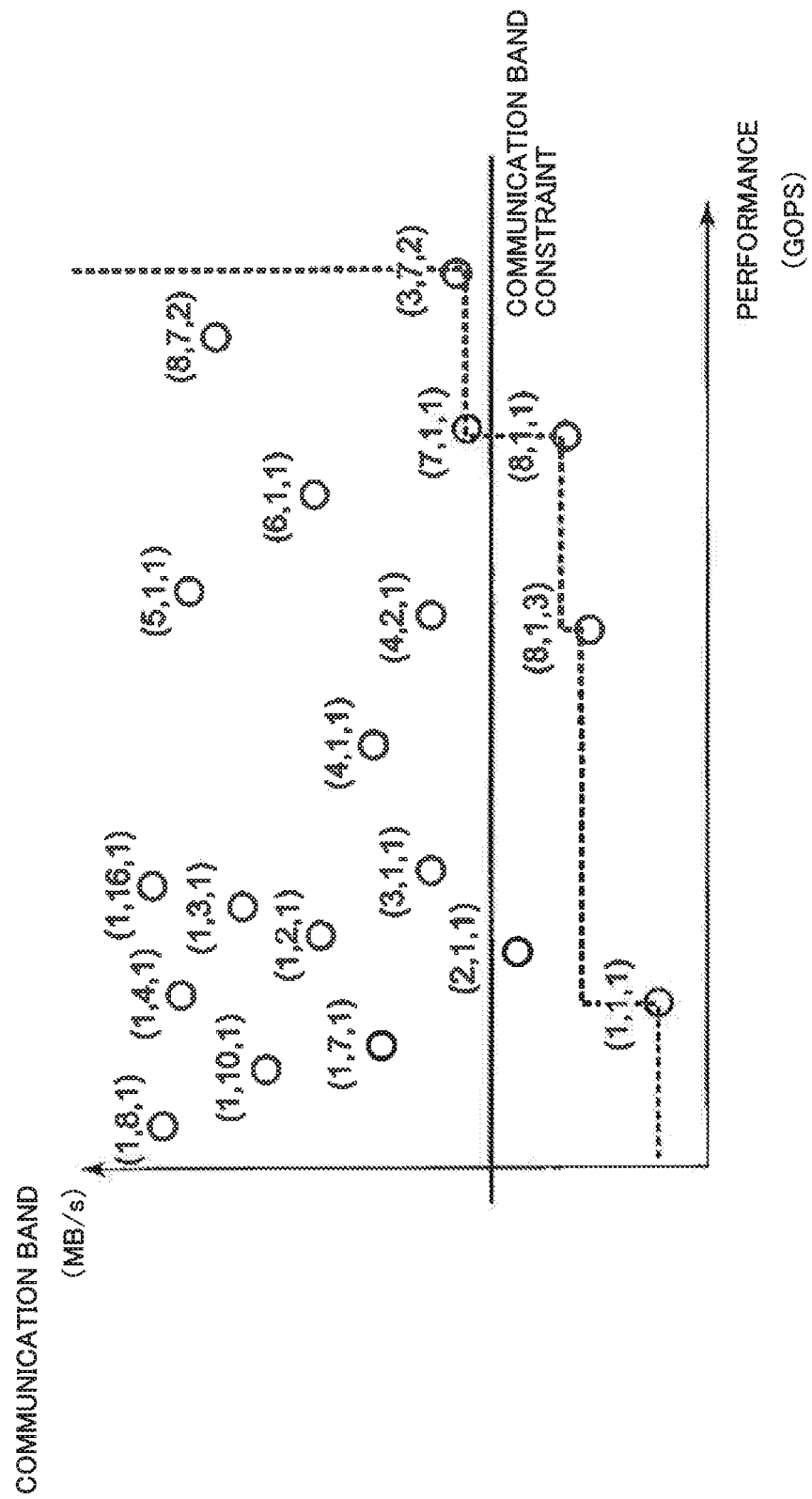
FIG. 10 is a diagram illustrating a display example of solution candidates output from the design space search unit used for the design assistance device.

FIG. 10 is a diagram illustrating a display example of solution candidates. In this case, the relationship between a communication band and a performance is illustrated. In a graph, the horizontal axis represents the performance and the vertical axis represents the communication band. This graph indicates that the performance increases and the required communication band decreases toward the lower right.

For example, the communication band is represented by Mega Byte/Second (MB/s), and the performance is represented by GOPS (Giga Operation Per Second). Each circle represents a solution candidate, and numbers above each circle indicate (a process allocation number, a data allocation number, and a process implementation scheme listing unit number). For example, (1, 1, 1) indicates a combination of a process allocation 1, a data allocation 1, and a process implementation scheme 1. A solid line indicates a communication band constraint in the target system (computer system) 10. Specifically, candidates located above the solid line cannot be implemented because the candidates do not satisfy the communication band constraint.

In the example of FIG. 10, a solution candidate (8, 1, 1) is a solution with a highest performance among candidates satisfying the constraint.

As is obvious from the above description, according to this example embodiment, an advantageous effect that design workloads can be reduced is obtained. This is because, for each process in the input program 200, a plurality of computing unit implementation schemes are listed; each computing unit implementation scheme is evaluated by high-level synthesis; a required communication band is estimated based on the evaluated result and data arrangement; each process arrangement in the input program 200 and each data arrangement and computing unit implementation scheme in the input program 200 are used as search candidates; and a design space is searched under a constraint of the input communication band, thereby eliminating a redesign due to the fact that a communication band constraint violation is identified after completion of design.

Description of Operation

Figure 2:
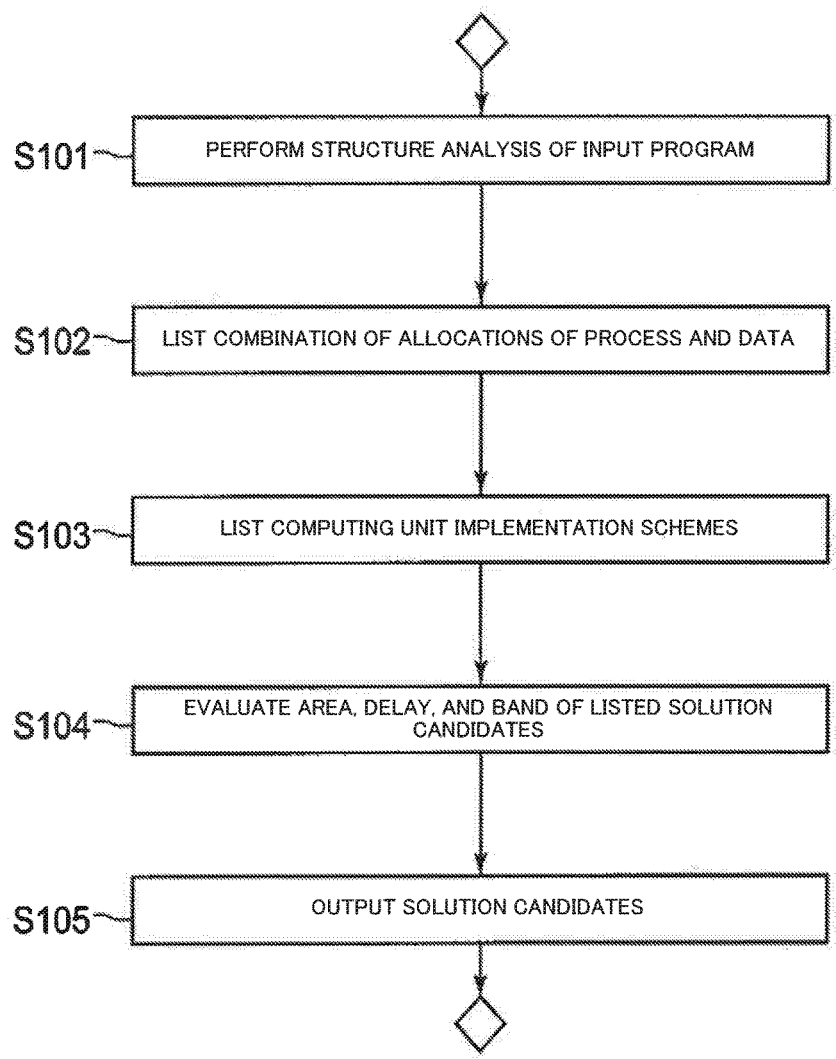
FIG. 2 is a flowchart for illustrating an operation of the entire design assistance device.

FIG. 2 is a flowchart illustrating an overall operation of the design assistance device 100.

First, in step S101, the program analysis unit 110 analyzes the input program 200, and extracts a function name and a variable name in the analyzed information as the process 210 and the data 220. Next, in step S102, the design space search unit 130 lists combinations of each process 210 and each data 220 to be allocated to either the CPU 12 or the accelerator 14. Next, in step S103, the design space search unit 130 lists computing unit implementation schemes for each process 210 allocated to the accelerator 14 in the combination. In this case, as described above, the computing unit, the number of pipeline stages, DII, the data access method, and the like are assumed as the computing unit implementation scheme. However, one embodiment of the present invention is not limited to the above examples. In addition, the number of pipeline stages and the like may include parameters that are automatically determined depending on the frequency constraint, DII, and the like of a target accelerator.

The above description with reference to FIGS. 7A and 7B is an example of allocation for a case where one CPU and one Acc (accelerator) are used.

On the other hand, a plurality of accelerators or a plurality of types of accelerators are used as targets and a search problem as to which one of the accelerators allocates the process and data can be treated by the same concept. Specifically, when two types of accelerators are present, the number of targets to which the process or data are allocated is not two of the CPU or the accelerator, but is three of the CPU, an accelerator A, or an accelerator_B. In this case, for example, there are 3^3=27 combinations of process allocations.

In step S104, the computing unit implementation scheme evaluation unit 120 evaluates each area, delay, and band of the listed solution candidates. In step S105, the design space search unit 130 outputs the solution candidates.

Figure 3:
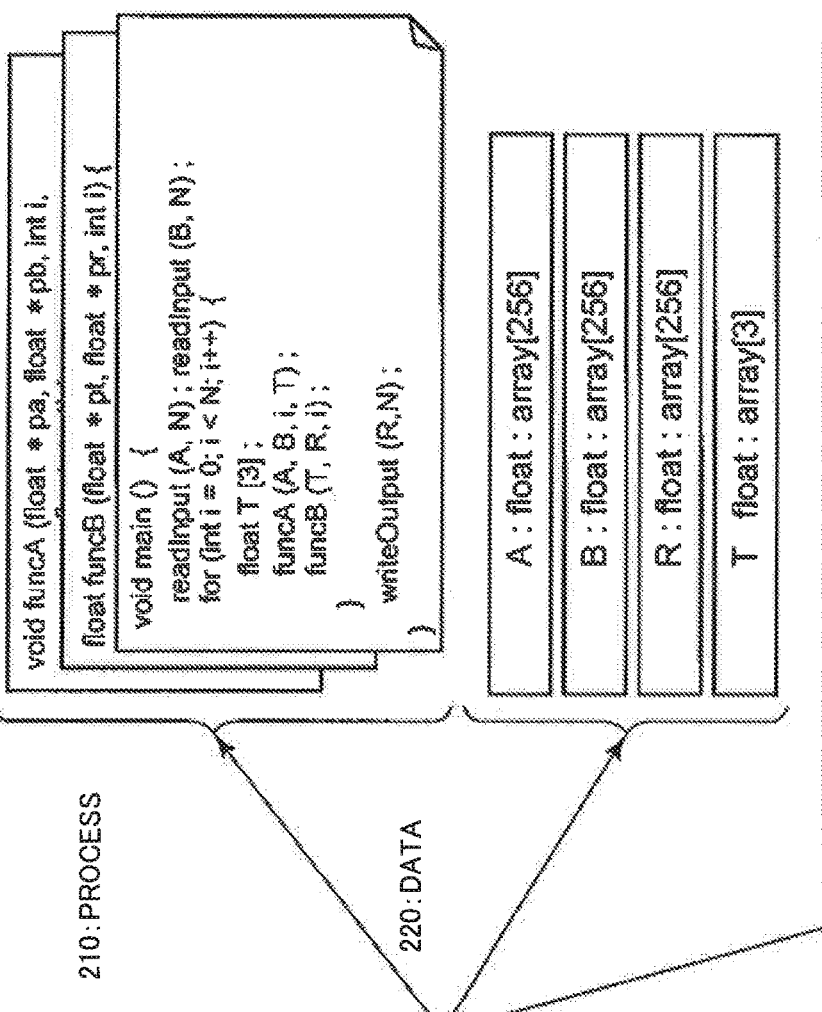
FIG. 3 is a diagram illustrating an input/output example of a program analysis unit used for the design assistance device.

FIG. 3 is a diagram illustrating an input/output example of the program analysis unit 110. The input program 200 includes three functions, i.e., funcA, funcB, and main. The data 220 include global array variables A, B, and R, and a local array variable T. In this case, as the processes 210, contents of the funcA function, the funcB function, and the main function are output. As the data 220, a variable name, a data type, and an array size of each of A, B, R, and T are output. As the relationship 230 between a process and data, the amount (bytes) of each function to access to each data is output. Note that the data 220 may indicate a scalar (single) variable, a class, a structure, or an array thereof.

For example, in FIG. 3, the relationship 230 between a process and data can be obtained as follows. For example, funcA is executed N=256 times. Further, in funcA, A and B are accessed once and T is accessed a total of three times, i.e., pt[0], pt[1], and pt[2]. Each data type is a float type, i.e., a 4-byte data type. Specifically, in funcA, data A and data B are accessed by 256×1×4=1024 bytes, data T are accessed by 256×3×4=3072 bytes. Data R are not accessed. Similarly, in the funcB and main, an amount of access to each data can be obtained.

Figure 4:
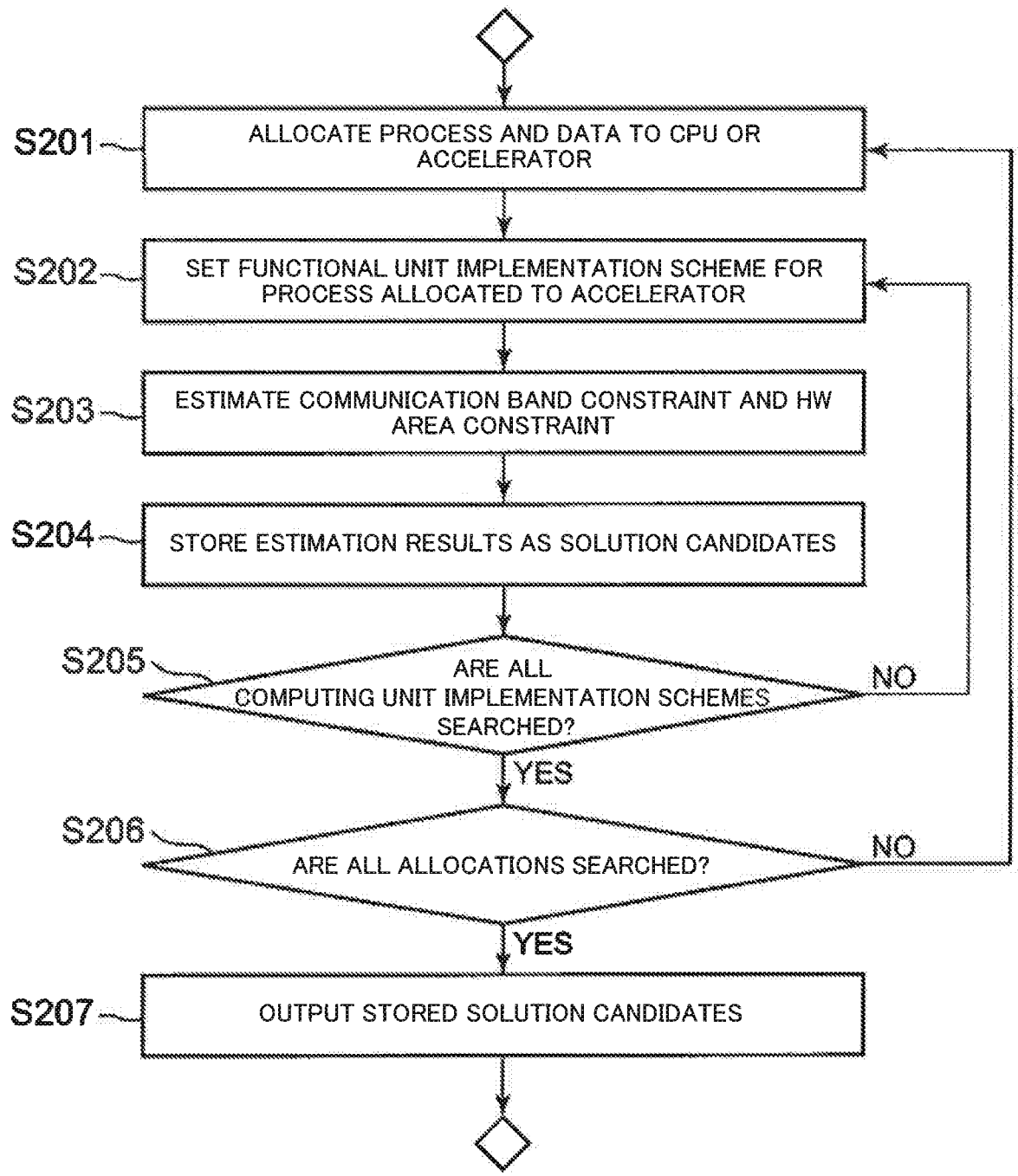
FIG. 4 is a flowchart for illustrating an operation of a design space search unit used for the design assistance device.

FIG. 4 is a flowchart for illustrating an operation of the design space search unit 130.

First, the design space search unit 130 lists combinations of each process 210 and each data 220 to be allocated to either the CPU 12 or the accelerator 14, and selects one allocation combination from among the combinations (step S201).

Next, the design space search unit 130 lists computing unit implementation schemes for the process 210 allocated to the accelerator 14, and selects one scheme from among the computing unit implementation schemes (step S202). Further, the design space search unit 130 estimates an area, a delay, and a communication band for the designated computing unit implementation scheme (step S203). In this case, the design space search unit 130 integrates the estimations of the area, the delay, and the communication band for each process, and determines whether or not the hardware constraint 250 and the software constraint 260 are satisfied. In this case, the estimations of the area, the delay, and the communication band for each process 210 can be obtained by using the computing unit implementation scheme evaluation unit 120, but instead the evaluated results may be reused. Then, the design space search unit 130 stores the evaluated results as solution candidates (step S204). The design space search unit 130 repeats this process until all computing unit implementation schemes are determined (step S205).

When the determination of all computing unit implementation schemes is completed (Y in step S205), the design space search unit 130 selects a combination for the subsequent allocation and then repeats the above process (step S206). When the determination of all allocations is completed (Y in step S206), the design space search unit 130 outputs the stored solution candidates (step S207).

The solution candidates may be output by the graphical user interface (GUI) that presents, to the designer, the solution candidates in the form of a graph, Pareto's curve, or the like. Further, the design space search unit 130 may output an execute form corresponding to the solution candidate selected by the designer. When the FPGA is used as the accelerator 14, the execute form described herein includes a description for FPGA, including an RTL description for a process by a corresponding computing unit implementation scheme and various interface RTL descriptions, and a program obtained by changing a process portion allocated to an accelerator in an input program to an accelerator call description.

Figure 11:
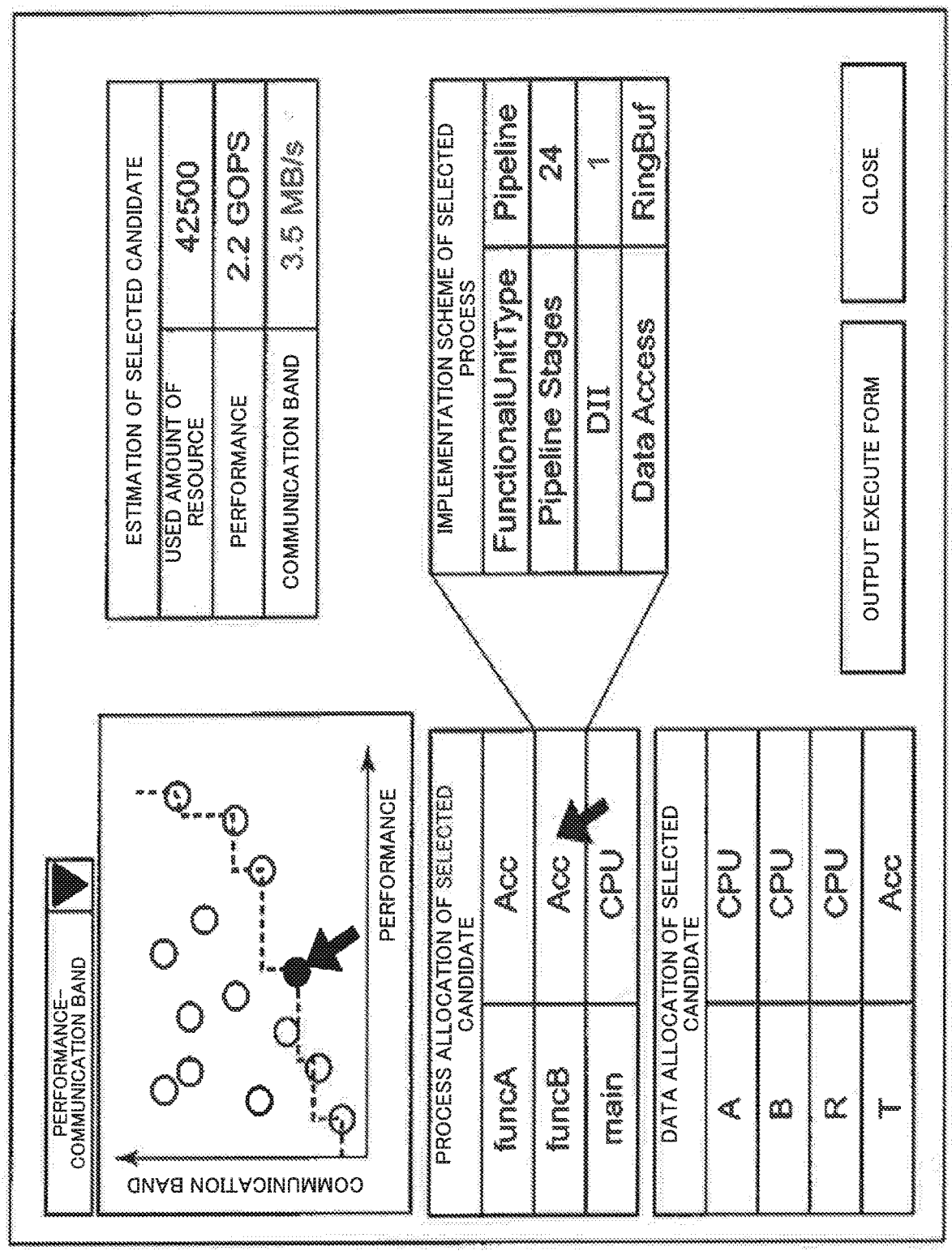
FIG. 11 is a diagram illustrating an example of a GUI for displaying solution candidates.

FIG. 11 is a diagram illustrating an example of the GUI. When a candidate in the graph located at the upper left is selected, a process allocation and a data allocation for the candidate are displayed on the lower left. When a process is selected, the implementation scheme for the selected process is displayed at the right. Further, on the upper right of the screen, the estimation of each of the resource, the performance, and the communication band for the selected candidate is displayed. When a button located at the lower right of the screen is pressed, the execute form corresponding to the selected candidate can be generated. Further, the content displayed in the graph, such as the relationship between a resource and a performance, can be changed by selecting a combo box located at the upper left of the screen.

Figure 13:
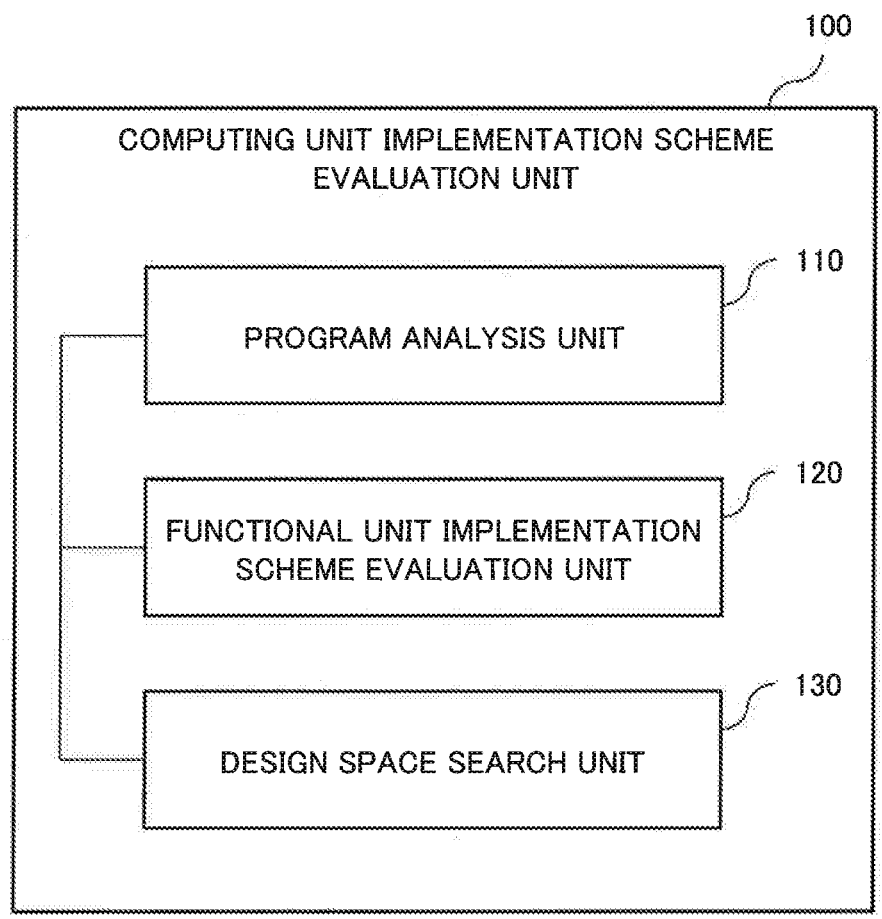
FIG. 13 is a diagram illustrating an outline of a design assistance device according to an aspect of the present invention.

Next, an outline of the design assistance device according to an aspect of the present invention will be described with reference to FIG. 13. Note that the design assistance device is a device for a computer system including a CPU and an accelerator. The design assistance device 100 includes a program analysis unit 110, a computing unit implementation scheme evaluation unit 120, and a design space search unit 130.

The program analysis unit 110 extracts, from the input program described in a high-level language, a process including a function and data including a variable, which are included in the input program, and analyzes the relationship between the process and the data including the amount of access to the data from the process based on the number of times of execution of the function or a loop.

The computing unit implementation scheme evaluation unit 120 evaluates, for the obtained process, the used amount of resource, delay, and communication band of the accelerator based on a hardware specification including the operating frequency and the model number of the accelerator.

The design space search unit 130 generates, for the obtained process and data, candidates represented by a combination of allocations to the CPU and the accelerator, and obtains and presents the used amount of resource, communication band, and performance of the input program as a whole based on a result obtained for each of the candidates by the evaluation of the computing unit implementation scheme evaluation unit 120.

In this manner, the design assistance device 100 can evaluate, for each of the candidates represented by a combination of allocations to the CPU and the accelerator, various computing unit implementation schemes and data arrangements for each process, and can present the candidates after estimating the communication band and the like. Consequently, backtracking of design is prevented and a reduction in design period is achieved.

Next, advantageous effects of this example embodiment will be described. In the related techniques, the computing unit implementation scheme, such as DII, is not used as a search parameter for design space search. Further, when the computing unit implementation scheme (e.g., DII) is changed, an amount of input/output data required per cycle of the accelerator 14 is changed, so that the communication band required for communication between the CPU 12 and the accelerator 14 varies. In some cases, the required communication band exceeds the communication band that can be implemented by hardware, and thereby a communication wait time occurs in the accelerator 14, which may make it difficult to achieve the assumed application performance. Further, the required communication band is greatly affected by whether the data are arranged in the CPU-side memory 16 or arranged in the accelerator-side memory 18. Therefore, in the related techniques in which the data arrangement is not taken into consideration, an optimum design cannot be obtained, or it takes a long time to obtain an optimum design.

On the other hand, in this example embodiment, various computing unit implementation schemes and data arrangements are evaluated for each process and an estimated communication band is presented to the designer, thereby making it possible to prevent backtracking of design. In other words, it can be said that this example embodiment achieves shortening of a design period as compared with the related techniques.

Note that each unit of the design assistance device may be implemented by using a combination of hardware and software. In a configuration using a combination of hardware and software, a design assistance program is loaded into a random access memory (RAM) and hardware, such as a control unit (central processing unit (CPU)), is caused to operate based on the program, thereby implementing each unit as various means. The program may also be recorded on a recording medium to be distributed. The program recorded on the recording medium is loaded into the memory via a wired or wireless communication, or via a recording medium itself, thereby causing the control unit or the like to operate. Note that examples of the recording medium include an optical disk, a magnetic disk, a semiconductor memory device, a hard disk, and the like.

The above-described example embodiment can be expressed in another way as follows. The example embodiment can be implemented by causing a computer operated as the design assistance device to operate as the program analysis unit 110, the computing unit implementation scheme evaluation unit 120, and the design space search unit 130 based on an image processing program loaded into the RAM.

Specific configurations of one embodiment of the present invention are not limited to the above described example embodiment, and modifications made within the scope of the invention are also included in the invention.

While the present invention has been described above with reference to the example embodiment, the present invention is not limited to the above-described example embodiment. The configuration and details of the present invention can be modified in various ways that can be understood by those skilled in the art within the scope of the present invention.

Figure 12:
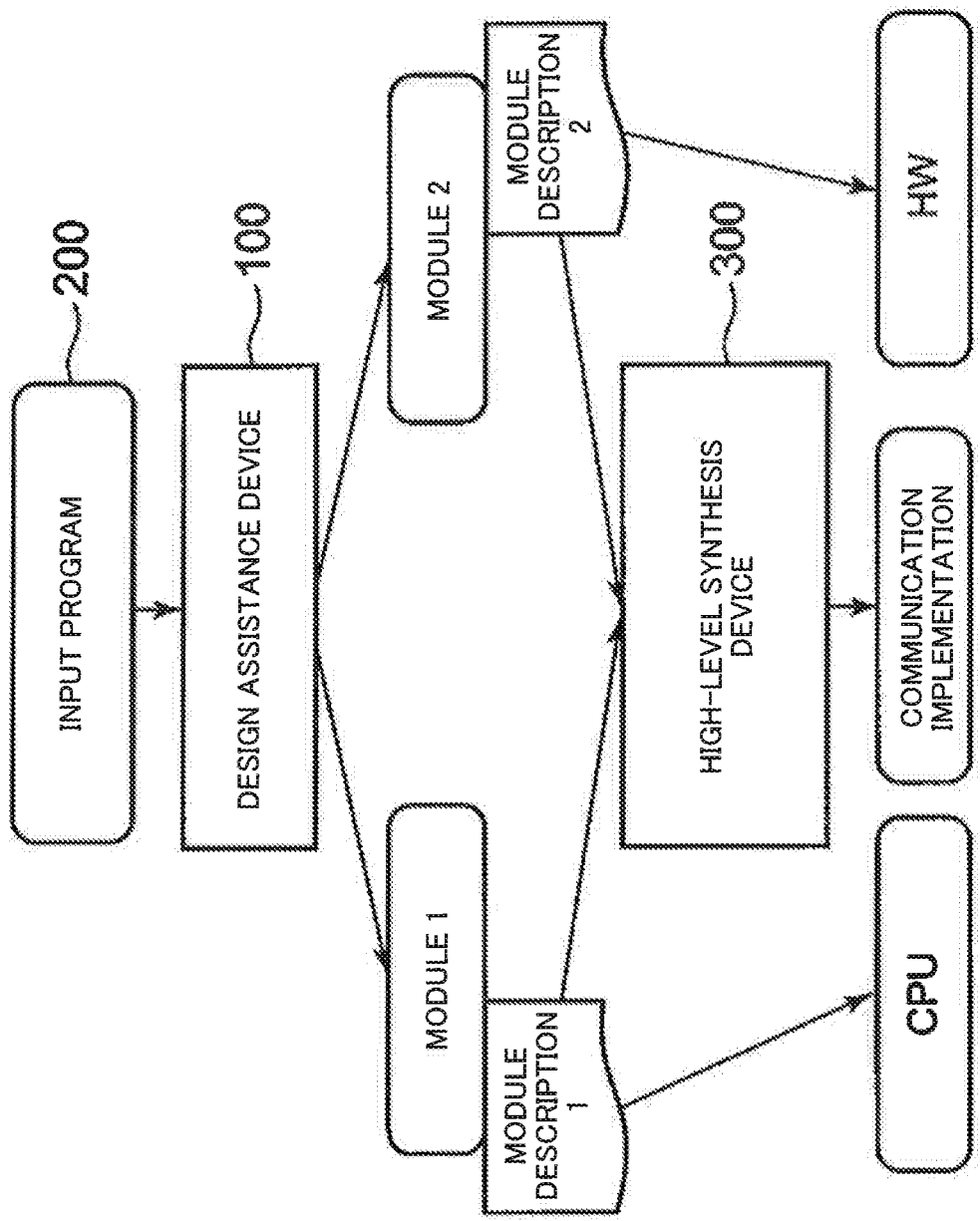
FIG. 12 is a block diagram illustrating an integrated configuration of a design assistance device and a high-level synthesis device according to one example embodiment of the present invention.

Note that the implementation scheme between processes can be optimized by using a high-level synthesis device 300 as illustrated in FIG. 12 for an optimum process arrangement obtained by the design assistance device 100 according to the example embodiment of the present invention.

The whole or part of the above-described example embodiment can be described as, but not limited to, the following supplementary notes.

(Supplementary note 1) A design assistance device for a computer system including a CPU and an accelerator, the design assistance device comprising:

a program analysis means for extracting, from an input program described in a high-level language, a process including a function and data including a variable, which are included in the input program, and analyzing a relationship between a process and data including an amount of access from the process to the data based on the number of times of execution of the function or a loop;

a computing unit implementation scheme evaluation means for evaluating, for the obtained process, a used amount of resource, a delay, and a communication band of the accelerator based on a hardware specification including an operating frequency and a model number of the accelerator; and a design space search means for generating, for the obtained process and data, candidates represented by a combination of allocations to the CPU and the accelerator, and obtaining and presenting, for each of the candidates, a used amount of resource, a communication band, and a performance of the input program as a whole based on a result obtained for each of the candidates by the evaluation of the computing unit implementation scheme evaluation means.

(Supplementary note 2) The design assistance device according to supplementary note 1, in which the computing unit implementation scheme evaluation means generates a pipeline computing unit as the accelerator by using a high-level synthesis means, and estimates a used amount of resource and a delay of the generated pipeline computing unit.

(Supplementary note 3) The design assistance device according to supplementary note 2, in which the computing unit implementation scheme evaluation means evaluates the pipeline computing unit based on computing unit implementation scheme designation information generated by the design space search means.

(Supplementary note 4) The design assistance device according to supplementary note 3, in which the computing unit implementation scheme designation information includes designation of a data initiation interval of the pipeline computing unit.

(Supplementary note 5) The design assistance device according to supplementary note 2, in which the computing unit implementation scheme evaluation means estimates a communication band required for the pipeline computing unit.

(Supplementary note 6) The design assistance device according to supplementary note 1, in which the design space search means searches for a design space by using the communication band between the CPU and the accelerator as a constraint.

(Supplementary note 7) A design assistance method executed by a design assistance device for a computer system including a CPU and an accelerator, the design assistance method comprising:

extracting, by a program analysis means, a process including a function and data including a variable, which are included in an input program, from the input program described in a high-level language, and analyzing a relationship between a process and data including an amount of access from the process to the data based on the number of times of execution of the function or a loop;

evaluating, by a computing unit implementation scheme evaluation means, a used amount of resource, a delay, and a communication band of the accelerator for the obtained process based on a hardware specification including an operating frequency and a model number of the accelerator; and generating, by a design space search means, candidates represented by a combination of allocations to the CPU and the accelerator for the obtained process and data, obtaining, for each of the candidates, a used amount of resource, a communication band, and a performance of the input program as a whole based on a result obtained by the evaluation of the computing unit implementation scheme evaluation means, and presenting the used amount of resource, the communication band, and the performance in a manner selectable by a designer.

(Supplementary note 8) The design assistance method according to supplementary note 7, in which the computing unit implementation scheme evaluation means generates a pipeline computing unit as the accelerator by using a high-level synthesis means, and estimates a used amount of resource and a delay of the generated pipeline computing unit.

(Supplementary note 9) The design assistance method according to supplementary note 8, in which the computing unit implementation scheme evaluation means evaluates the pipeline computing unit based on computing unit implementation scheme designation information generated by the design space search means.

(Supplementary note 10) The design assistance method according to supplementary note 9, in which the computing unit implementation scheme designation information includes designation of a data initiation interval of the pipeline computing unit.

(Supplementary note 11) The design assistance method according to supplementary note 8, in which the computing unit implementation scheme evaluation means estimates a communication band required for the pipeline computing unit.

(Supplementary note 12) The design assistance method according to supplementary note 7, in which the design space search means searches for a design space by using a communication band between the CPU and the accelerator as a constraint.

(Supplementary note 13) A design assistance program for causing a computer to perform design assistance for a computer system including a CPU and an accelerator, the design assistance program causing the computer to execute:

a program analysis procedure of extracting a process including a function and data including a variable, which are included in the input program, from an input program described in a high-level language, and analyzing a relationship between a process and data including an amount of access from the process to the data based on the number of times of execution of the function or a loop;

a computing unit implementation scheme evaluation procedure of evaluating a used amount of resource, a delay, and a communication band of the accelerator for the obtained process based on a hardware specification including an operating frequency and a model number of the accelerator; and a design space search procedure of generating candidates represented by a combination of allocations to the CPU and the accelerator for the obtained process and data, obtaining, for each of the candidates, a used amount of resource, a communication band, and a performance of the input program as a whole based on a result obtained in the computing unit implementation scheme evaluation procedure, and presenting the used amount of resource, the communication band, and the performance in a manner selectable by a designer.

(Supplementary note 14) The design assistance program according to supplementary note 13, in which the computing unit implementation scheme evaluation procedure causes the computer to generate a pipeline computing unit as the accelerator by using a high-level synthesis means, and to estimate a used amount of resource and a delay of the generated pipeline computing unit.

(Supplementary note 15) The design assistance program according to supplementary note 14, in which the computing unit implementation scheme evaluation procedure causes the computer to evaluate the pipeline computing unit based on computing unit implementation scheme designation information generated in the design space search procedure.

(Supplementary note 16) The design assistance program according to supplementary note 15, in which the computing unit implementation scheme designation information includes a designation of a data initiation interval of the pipeline computing unit.

(Supplementary note 17) The design assistance program according to supplementary note 14, in which the computing unit implementation scheme evaluation procedure causes the computer to estimate a communication band required for the pipeline computing unit.

(Supplementary note 18) The design assistance program according to supplementary note 13, in which the design space search procedure causes the computer to search for a design space by using a communication band between the CPU and the accelerator as a constraint.

REFERENCE SIGNS LIST

10 Computer system (target system)
12 CPU
14 Accelerator
16 CPU-side memory
18 Accelerator-side memory
20 Bus
100 Design assistance device
110 Program analysis unit (profiler)
120 Computing unit implementation scheme evaluation unit
122 High-level synthesis unit
130 Design space search unit
131 Process allocation listing unit
132 Data allocation listing unit
133 Computing unit implementation scheme listing unit
134 Solution candidate storage unit
135 Solution candidate display unit
136 Area estimation unit
137 Performance estimation unit
138 Communication band estimation unit
200 Input program
210 Process
220 Data
230 Relationship between process and data
250 Target HW constraint
260 Target SW constraint

The invention claimed is:

1. A design assistance device for a computer system including a CPU and an accelerator, the design assistance device comprising:
  a program analyzer configured to extract, from an input program described in a high-level language, a process including a function and data including a variable, which are included in the input program, and analyze a relationship between a process and data, the relationship including an amount of access from the process to the data, based on a number of times of execution of the function;
  a computing unit implementation scheme evaluator configured to evaluate a used amount of resource, a delay, and a communication band of the accelerator against the acquired process, based on a hardware specification including an operating frequency and a model number of the accelerator; and
  a design space searcher configured to generate candidates of a combination of allocations to the CPU and the accelerator against the acquired process and data, and acquire and present, for each of the candidates, a used amount of resource, a communication band, and performance of the input program as a whole, based on a result of evaluation of the computing unit implementation scheme evaluator.

2. The design assistance device according to claim 1, wherein the accelerator is a pipeline computing unit as generated by using a high-level synthesizer, and the computing unit implementation scheme evaluator estimates a used amount of resource and a delay of the generated pipeline computing unit.

3. The design assistance device according to claim 2, wherein the design space searcher generates computing unit implementation scheme designation information, and the computing unit implementation scheme evaluator evaluates the pipeline computing unit, based on the computing unit implementation scheme designation information.

4. The design assistance device according to claim 3, wherein the computing unit implementation scheme designation information includes designation of a data initiation interval of the pipeline computing unit.

5. The design assistance device according to claim 2, wherein the computing unit implementation scheme evaluator estimates a communication band required for the pipeline computing unit.

6. The design assistance device according to claim 1, wherein the design space searcher searches for a design space by using a communication band between the CPU and the accelerator as a constraint.

7. A design assistance method executed by a design assistance device for a computer system including a CPU and an accelerator, the design assistance method comprising:
  extracting, from an input program described in a high-level language, a process including a function and data including a variable, which are included in the input program, and analyzing a relationship between a process and data, the relationship including an amount of access from the process to the data, based on a number of times of execution of the function;
  evaluating a used amount of resource, a delay, and a communication band of the accelerator against the acquired process, based on a hardware specification including an operating frequency and a model number of the accelerator; and
  generating candidates of a combination of allocations to the CPU and the accelerator against the acquired process and data, and acquiring and presenting, for each of the candidates, a used amount of resource, a communication band, and performance of the input program as a whole, based on the evaluation result.

8. The design assistance method according to claim 7, further comprising:
  generating a pipeline computing unit as the accelerator, and estimating a used amount of resource and a delay of the generated pipeline computing unit.

9. The design assistance method according to claim 8, wherein further comprising:
  evaluating the pipeline computing unit, based on computing unit implementation scheme information including a number of pipeline stages and a data access method of the pipeline computing unit.

10. The design assistance method according to claim 9, wherein the computing unit implementation scheme designation information includes designation of a data initiation interval of the pipeline computing unit.

11. The design assistance method according to claim 8, further comprising:
  estimating a communication band required for the pipeline computing unit.

12. The design assistance method according to claim 7, further comprising:

searching for a design space by using a communication band between the CPU and the accelerator as a constraint.

13. A non-transitory recording medium storing a design assistance program causing a computer to perform design assistance for a computer system including a CPU and an accelerator, the design assistance program causing the computer to execute processing of:
- extracting, from an input program described in a high-level language, a process including a function and data including a variable, which are included in the input program, and analyzing a relationship between a process and data, the relationship including an amount of access from the process to the data, based on a number of times of execution of the function;
- evaluating a used amount of resource, a delay, and a communication band of the accelerator against the acquired process, based on a hardware specification including an operating frequency and a model number of the accelerator; and
- generating candidates of a combination of allocations to the CPU and the accelerator against the acquired process and data, and acquiring and presenting, for each of the candidates, a used amount of resource, a communication band, and performance of the input program as a whole, based on the evaluation result.

14. The non-transitory recording medium storing the design assistance program according to claim 13, the design assistance program causing the computer to execute further processing of: generating a pipeline computing unit as the accelerator and estimating a used amount of resource and a delay of the generated pipeline computing unit.

15. The non-transitory recording medium storing the design assistance program according to claim 14, the design assistance program causing the computer to execute further processing of: evaluating the pipeline computing unit, based on computing unit implementation scheme designation information including a number of pipeline stages and a data access method of the pipeline computing unit.

16. The non-transitory recording medium storing the design assistance program according to claim 15, wherein the computing unit implementation scheme designation information includes designation of a data initiation interval of the pipeline computing unit.

17. The non-transitory recording medium storing the design assistance program according to claim 13, the design assistance program causing the computer to execute further processing of: estimating a communication band required for the pipeline computing unit.

18. The non-transitory recording medium storing the design assistance program according to claim 13, the design assistance program causing the computer to execute further processing of: searching for a design space by using a communication band between the CPU and the accelerator as a constraint.

* * * * *